United States Patent
Robic et al.

(10) Patent No.: US 6,593,036 B1
(45) Date of Patent: Jul. 15, 2003

(54) STRUCTURE FOR A REFLECTION LITHOGRAPHY MASK AND METHOD FOR MAKING SAME

(75) Inventors: Jean-Yves Robic, Grenoble (FR); Bernard Aspar, Rives (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/786,983

(22) PCT Filed: Jul. 28, 2000

(86) PCT No.: PCT/FR00/02176
§ 371 (c)(1), (2), (4) Date: Mar. 13, 2001

(87) PCT Pub. No.: WO01/09680
PCT Pub. Date: Feb. 8, 2001

(30) Foreign Application Priority Data

Jul. 29, 1999 (FR) .............................................. 99 09842

(51) Int. Cl.⁷ ................................................. G03F 9/00
(52) U.S. Cl. .......................................................... 430/5
(58) Field of Search ............................................. 430/5

(56) References Cited

U.S. PATENT DOCUMENTS

| | | | |
|---|---|---|---|
| 5,328,784 A | * 7/1994 | Fukuda | 430/5 |
| 6,015,640 A | * 1/2000 | Cardinale | 430/5 |
| 6,150,060 A | * 11/2000 | Vernon | 430/5 |
| 6,410,193 B1 | * 6/2002 | Stivers et al. | 430/5 |

OTHER PUBLICATIONS

Pei–yang Yan, et al. "EUV Mask Patterning Approaches", *Emerging Lighographic Technologies III, Santa Clara*, CA, USA, Mar. 1999, p. 309–313 XP002135877.

* cited by examiner

*Primary Examiner*—Christopher G. Young
(74) *Attorney, Agent, or Firm*—Thelen Reid & Priest LLP

(57) ABSTRACT

The invention concerns a structure for a lithographic reflection mask comprising a receive medium (12) on which is fixed a reflector (11) including at least one layer, the reflector (11) being fixed to the receive medium (12) in a reverse manner relative to a manufacturing medium (10) on which it has previously been manufactured and which is then

17 Claims, 5 Drawing Sheets

STRUCTURE FOR A REFLECTION LITHOGRAPHY MASK AND METHOD FOR MAKING SAME

"This application is a national phase of PCT/FR00/02176 which was filed on Jul. 28, 2000, and was not published in English."

TECHNICAL FIELD

The present invention concerns a structure for a lithographic reflection mask, in particular for extreme ultra-violet lithography (EUV). Such a mask may be used particularly in the manufacture of integrated circuits.

The invention also concerns a process for manufacturing a structure for a lithographic reflection mask.

THE PRIOR ART

Lithography or photo-lithography is the process which allows the image of a mask to be transferred into a layer of photo-sensitive resin deposited on a sample. This exposure stage of a resin through a mask, by means of a light source and an optical system, is achieved on so-called photo-masking equipment. After exposure, the resin is revealed thus making it possible to obtain on the sample a resin mask which will be used in the stages required in the manufacture of a micro-electronic device (engraving mask, depositing mask or ion implantation mask).

Progress in optical lithography has been the key factor in the growth of the integrated circuit (IC) industry over recent years, the main vector of improvement being the use of a shorter and shorter wavelength for exposing the resins. Thus, lithography has gone from 365 nm to 248 nm and today to 193 nm, the reduction in wavelength allowing the critical dimensions of ICs to be reduced to the point where they achieve dimensions of the order of a tenth of a $\mu$m. This technical progress and the availability, in time, of production facilities for photo-lithography, masks and resins has made it possible, for 30 years, for the micro-electronics industry to continue its growth in accordance with Moore's Law.

However, the pursuit of the miniaturisation of integrated circuits with sub-0.1 $\mu$m patterns requires a new technological approach at odds with optical lithography. Indeed, the refractive materials currently used for optical lithography become too absorbent for wavelengths below 190 nm. Different solutions known collectively as New Generation Lithography or NGL have been proposed. The stakes are high for the semi-conductor industry.

Among NGL, Extreme Ultra-Violet Lithography (EUV) using wavelengths of between 10 and 14 nm (soft X-ray radiation) is one of the most promising avenues. At these short wavelengths, resolution of below 0.1 $\mu$m may be obtained, while retaining a low numerical aperture and a depth of field above 1 $\mu$m. This technology may satisfy several sub-0.1 $\mu$m generations of technology until the 256 Gbit generation planned for production in 2012 by the Semiconductor Industry Association (SIA). EUV lithography is the solution prioritised by the international association of semi-conductor industries (International Sematech). Significant work is in progress on this in the United States, in Japan and in Europe.

The technological challenges set by the implementation of lithography in the extreme ultra-violet concern five aspects in particular: the EUV radiation source, the projection optics of the photo-masker, the masks, the resin processes and the metrology associated with the development of the optics and the masks.

Unlike current optical lithography masks (transmission masks made by depositing chrome on a quartz base) a mask for EUV lithography is a mask in reflection and no longer in transmission.

FIG. 1 is a transverse cross-section view of an EUV mask according to the prior art. This mask is composed of a substrate 1 on which is deposited a reflective coating 2 which is in its turn coated with an absorbent layer 3. The pattern to be projected on the resin to be exposed is formed on the mask by engraving the absorbent layer 3. Thus, only the engraved zones 4 will be reflecting and will register during lithographic projection as shown by the arrows in FIG. 1.

The substrate 1 may be a silicon chip with a diameter of 200 mm. Other substrates are conceivable to take account of problems of stability under luminous flux, for example a glass with a low coefficient of expansion.

The reflector 2 is constituted by a stack of multi-layers. A high reflection factor is obtained by means of an interferential structure of multi-layers and by the right choice of materials constituting the multi-layers. Molybdenum and silicon perform very well at the 13 nm wavelength and reflection factors above 65% may be obtained with about forty multi-layers, each multi-layer being formed of a layer of molybdenum and a layer of silicon. Other layers of materials are conceivable like for example Mo/Be or again Ru/Be.

The absorbent layer 3 must be absorbent in the spectral range of the EUV, particularly around 13 nm. The materials that may be used to constitute it are numerous. Materials used in micro-electronics (like Ti, Ta, TaSi, TiW, W, Cr, TiN, Al) are preferred. For optics having a reduction factor of 4, the size of the pattern engraved in the absorbent layer will be four times greater than the pattern exposed on the circuit. Reference is made to a graticule on a scale of 4X.

To keep to the specifications associated with the exposure stage, i.e. to print on the exposed resin a pattern of good geometric definition, retaining the required dimensions over the whole exposed zone and without defects, the manufacture of the mask must meet certain conditions. The mask must have excellent flatness, typically with distortion values below 0.4 $\mu$m for a diameter of 200 mm. Its coefficient of reflection must be sufficient to guarantee the dose of EUV radiation required for exposure, i.e. a coefficient of reflection above 60%. The absorbent layer must be made (deposit and engraving) in accordance with the required geometry. The surface defect density of the mask must be extremely low, of the order of some $10^{-3}$ defects/cm$^2$, for defects of dimensions equal to or above about 50 nm. The multi-layer and the absorbent layer constituting the mask are located in the object plane of the optical system. Consequently, any significant variation in phase or amplitude of the field reflected by the mask may potentially be replicated by the lithography process and may thus impart a crippling defect into the resin. If there are processes to repair defects in the absorbent layer, there is no satisfactory solution for repairing defects in the multi-layer reflector. This last condition remains the major problem in mastering the manufacture of masks. The best results obtained are of some $10^{-2}$ defects/cm$^2$.

Mask specifications, in terms of controlling shape and defects, presuppose the technological mastery of every stage in its manufacture. Masks are developed in two large stages:

manufacturing the multi-layer reflector substrate called the "mask blank" in the specialised literature, mask patterning, i.e. making the absorbent layer engraved on the multi-layer reflector substrate.

Several approaches have been proposed for making the masks: a process by direct engraving of the absorbent layer, a process by lift-off (see the article by H. KINOSHITA et al., "Mask technology of extreme ultraviolet lithography", SPIE vol. 3412, 358–368) and a process of the damascene type.

The process by direct engraving of the absorbent layer includes the following basic stages:

- depositing the multi-layer reflector on a substrate,
- possible depositing of protective and/or buffer layers (intermediate layers),
- depositing the absorbent layer by a process similar to that for depositing a metal film in micro-electronics,
- lithography stage (resin spreading, exposure, processing) to delimit the zones to be engraved,
- selective engraving of the absorbent layer, intermediate layers being possibly necessary between the absorbent layer and the multi-layer reflector to allow selective engraving and to protect the multi-layer,
- partial or total elimination by engraving of the intermediate layers, depending on the nature of said layers and on their transparency to the wavelength used, in engraved zones of the absorbent layer.

The damascene type process includes the following stages:

- depositing the receive multi-layer on a substrate,
- depositing and engraving another layer,
- depositing the absorbent layer and eliminating said layer above the non-engraved patterns of the previous layer.

The major difficulty with current processes lies in the presence of defects on the surface of the multi-layer reflector the size of which is greater than a critical dimension. These defects originate:

- in growth defects linked to defects or imperfections in the support (substrate),
- in defects generated during development of the multi-layer stack (pollution by particles while depositing or growth defects at each interface of the multi-layer).

Defects in thin layers, and all the more so in multi-layers, may be generated by very small defects. The size of the defects grows, by shadow effect, with the thickness of deposit coating them as the multi-layer is developed. Initiated as defects of non-critical size, the defects may on the surface exceed the critical size. The critical size will depend on the application.

FIG. 2 is a transverse cross-section view of a substrate 5 coated with a succession of layers intended to constitute the multi-layer reflector 6 of a mask according to the prior art. The references 7 and 8 represent defects initially of non-critical size and which have developed to the point where they exceed the critical size.

DISCLOSURE OF THE INVENTION

To overcome this problem of the prior art, it is proposed according to the present invention to reverse the multi-layer structure so that the first layer of the multi-layer (the one made first during its development) is the one positioned on the front face (illuminated face) in the final structure of the mask and not the opposite as in prior art structures. The advantage of this solution is that the apparent surface defects in the final structure of the mask will be smaller and less numerous. Disturbance by the defects of the reflected wave will be reduced. And this because, in a reflective system of interferential multi-layers, the contribution to the total reflection of the different reflective waves by each interface of the multi-layer decreases the further from the surface the interface under consideration is located.

A first object of the invention is constituted by a structure for a lithographic reflection mask comprising a receive medium on which is fixed a reflector including at least one layer, the reflector being fixed to the receive medium in a reverse manner relative to a manufacturing medium on which it has been previously manufactured.

Preferably, the reflector is a multi-layer, for example formed by an alternation of layers of molybdenum and silicon. Other materials of the prior art may of course be used.

The reflector may be fixed to the receive medium by means of a bonding layer.

If the reflector has been manufactured on a manufacturing medium coated with an absorbent layer for the wavelength of the source of lithography radiation used, the reflector and the absorbent layer may be fixed to the receive medium in a reverse manner relative to the manufacturing medium. Possibly, the absorbent layer coating the manufacturing medium is an engraved layer according to a desired mask pattern.

Thus, the patterns of the absorbent layer of the structure for the mask according to the invention may be made according to the direct or damascene type processes previously defined. These patterns may be made either before the formation of the reflector on the manufacturing medium as shown above, or after the formation of the reflector and its transfer onto the receive medium.

The receive medium may be a substrate of vitreous silica or of another material with a low coefficient of expansion.

A second object of the invention is constituted by a manufacturing process of a structure for a lithographic reflection mask, characterised in that it comprises the following stages:

- making a reflector on a manufacturing medium,
- fixing a receive medium on the reflector,
- at least partly eliminating the manufacturing medium.

The reflector may be made in the form of a multi-layer.

The process may include a preliminary stage of formation of an absorbent layer, for the wavelength of the source of lithographic radiation used, on the manufacturing medium before the reflector is made.

The fixing of the receive medium on the reflector may be achieved by molecular adhesion. To advantage, a bonding layer is used to fix the receive medium on the reflector.

According to an implementation variant, eliminating the manufacturing medium occurs by mechanical and/or mechanical-chemical and/or chemical thinning. Possibly, the manufacturing medium being provided, reflector side, with a barrier layer, the thinning occurs to the point of contact with the barrier layer. The manufacturing medium being eliminated using mechanical thinning, this may be stopped before complete elimination of the manufacturing medium, the elimination being then continued chemically.

According to another implementation variant, the manufacturing medium comprising, reflector side, a sacrificial layer, the elimination of the manufacturing medium is achieved by selective engraving of the sacrificial layer.

According to yet another implementation variant, the manufacturing medium is a substrate one face of which, intended to be located on the reflector side, has been implanted by gaseous radicals so as to form a layer of microcavities in the substrate and in proximity to the implanted face, the elimination of the manufacturing medium including the application of an anneal and/or mechanical force to obtain the cleavage of the manufacturing substrate along the layer of microcavities. There then remains a thin film. The barrier layer or the thin film may then be totally or partially eliminated according to the variants of the invention, i.e. totally where the transfer onto the receive medium is done with the absorbent patterns and totally or partially where the absorbent patterns are made after transfer of the reflection layer.

BRIEF DESCRIPTION OF THE DRAWINGS

The invention will be better understood and other advantages and particularities will emerge from reading the following description, given as a non-restrictive example, accompanied by the appended drawings among which.

DETAILED DESCRIPTION OF EMBODIMENTS OF THE INVENTION

Figure 1:
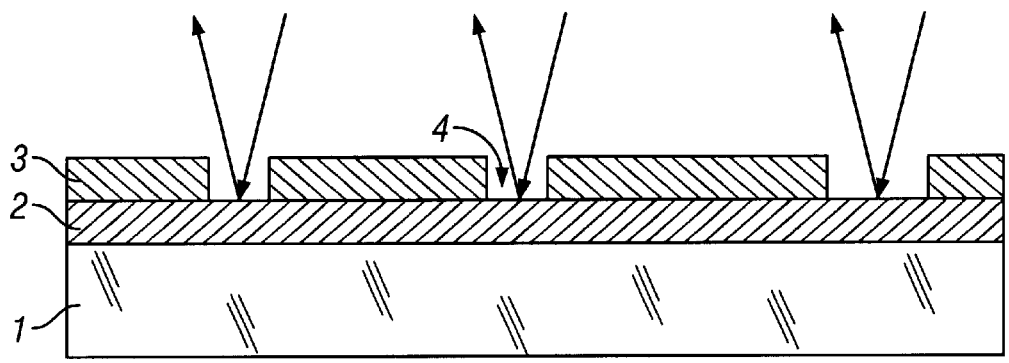
FIG. 1 is a transverse cross-section view of an EUV mask according to the prior art.
Figure 2:
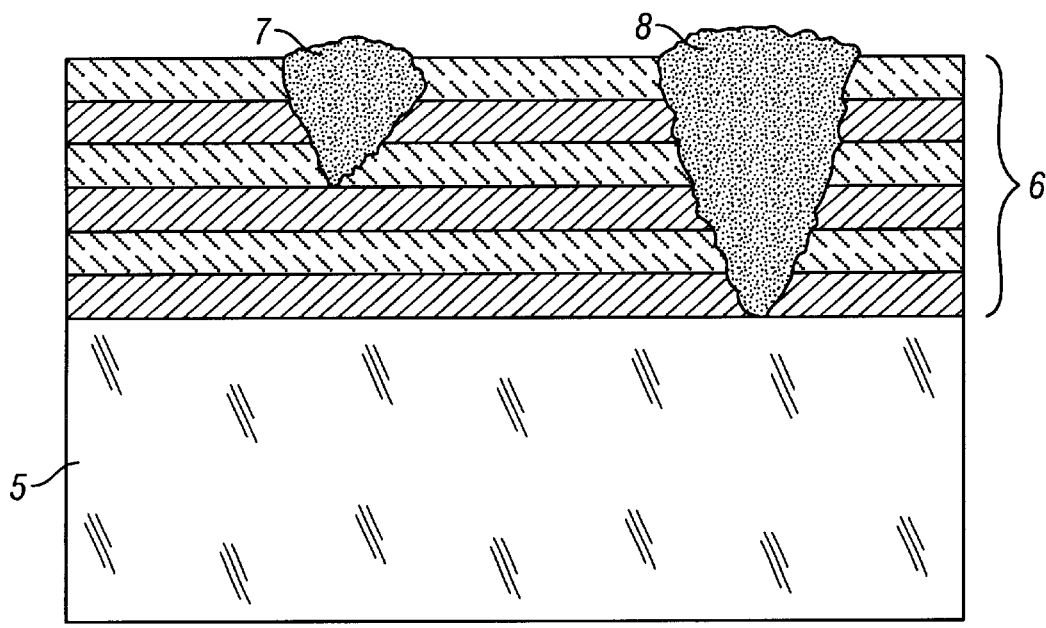
FIG. 2 is a transverse cross-section view of a structure for a lithographic reflection mask according to the prior art where defects are highlighted.
Figure 3A:
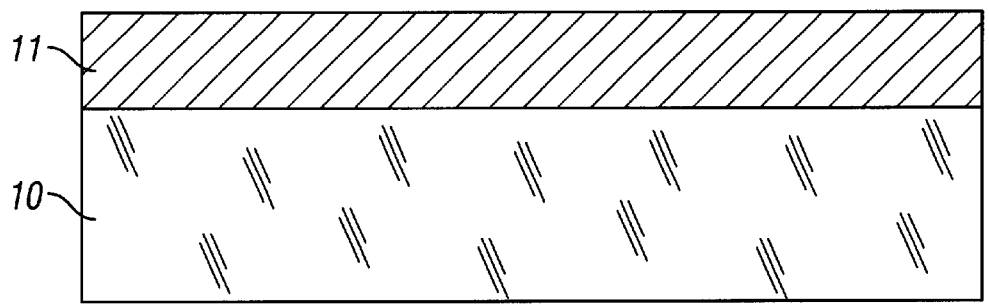
FIGS. 3A to 3C show, in its principle, the process for manufacturing a structure for a lithographic reflection mask according to the invention.
Figure 3B:
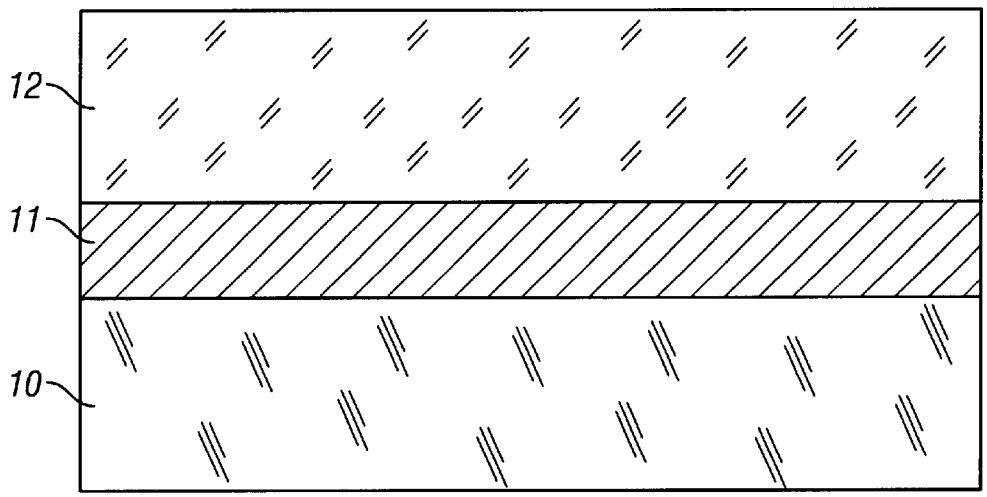
Figure 3C:
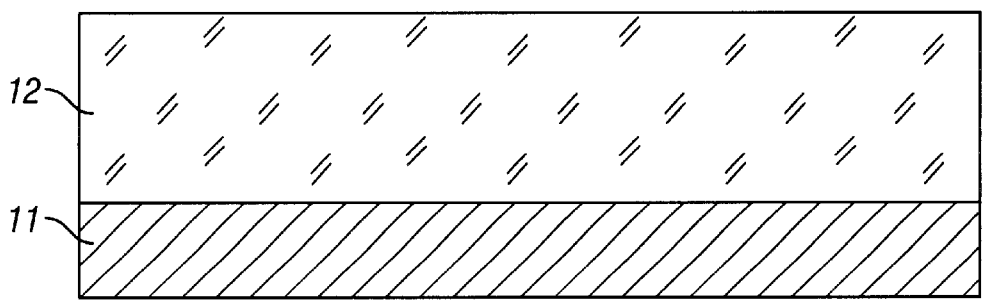

The principle of the process for manufacturing according to the invention a structure for a lithographic reflection mask is shown in FIGS. 3A to 3C.

FIG. 3A shows, in transverse cross-section, a manufacturing medium 10 coated on one of its two main faces by a reflector 11 constituted by one or more layers. The reflector has one free face on which is fixed a receive medium 12 (see FIG. 3B). After elimination of the manufacturing medium, as shown in FIG. 3C, a receive medium 12 is obtained to which the reflector 11 is fixed.

Depending on its constitution, the manufacturing medium may be eliminated in several different ways. If this medium is monolithic, it may be eliminated by abrasion or by mechanical-chemical polishing. If this medium comprises, reflector side, a sacrificial layer able to be engraved selectively relative to the other elements of the assembly shown in FIG. 3B, this sacrificial layer may be engraved selectively so as to salvage the rest of the manufacturing medium. If the manufacturing medium comprises a zone of cleavage obtained by ion implantation according to the lessons to be learnt in document FR-A-2 681 472, an adapted thermal treatment and/or the use of mechanical force allows the separation of the major part of the manufacturing medium, the thin film remaining on the reflector being able to be then lifted off, totally or partially, or retained.

Figure 4A:
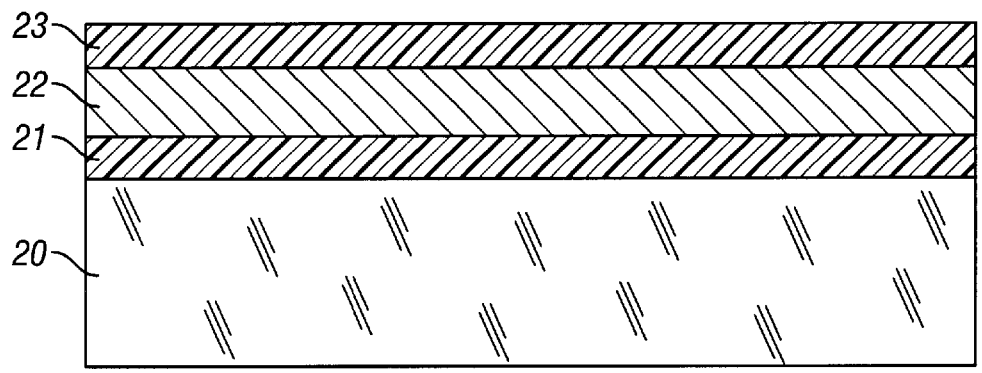
FIGS. 4A to 4C show a first variant of the process for manufacturing a structure for a lithographic reflection mask according to the invention.
Figure 4B:
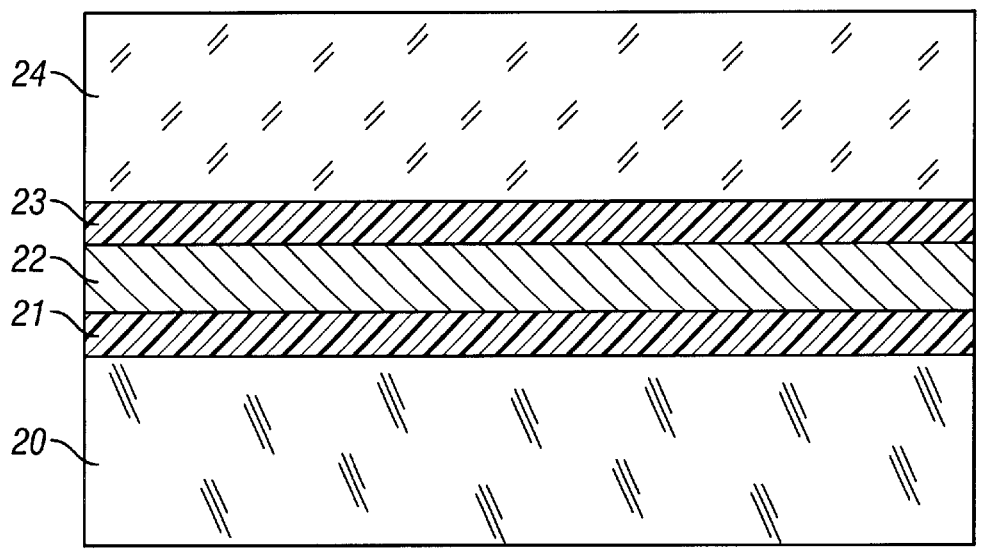
Figure 4C:
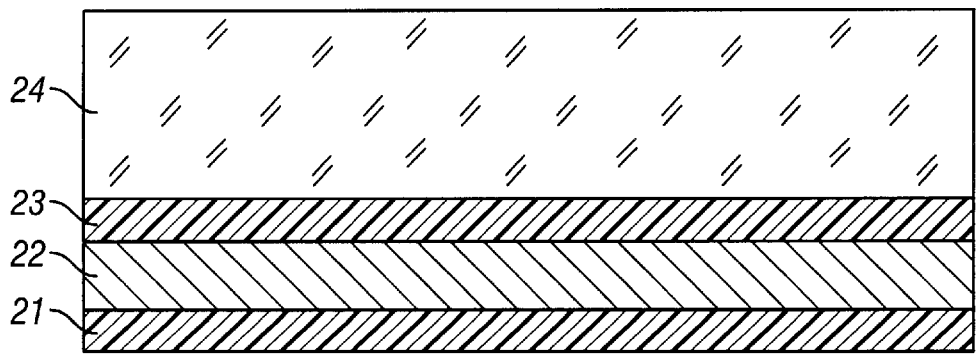

FIGS. 4A to 4C are transverse cross-section views showing a first variant of the process according to the invention.

FIG. 4A shows a manufacturing medium 20 made for example of silicon, of a thickness of about 500 μm. This is a chip currently used in micro-electronics and which receives a standard cleaning. A thermal layer 21 of $SiO_2$ of a thickness of 200 nm is manufactured on the surface of the medium 20. This layer 21 acts as a barrier layer. It is particularly useful if mechanical or mechanical-chemical thinning is used subsequently to eliminate the manufacturing medium.

The next stage is to deposit the reflector 22 on the barrier layer 21. The reflector 22 is for example constituted by 40 pairs of Mo/Si layers starting and finishing with a layer of silicon.

It may be advantageous next to deposit a bonding layer 23 on the stack. This bonding layer 23 is for example a layer of $SiO_2$ of the TEOS type.

As may be seen in FIG. 4B, a receive medium 24 is bonded onto the free face of the bonding layer 23. The receive medium 24 may be a substrate of vitreous ultra-pure silica with a roughness below 0.5 nm RMS (root mean square value). Before bonding, cleaning of the hydrophilic type is for example carried out, the bonding being obtained by molecular adhesion. The bonding forces are sufficient at ambient temperature. However, it is advantageous to carry out an anneal at 150° C. for 4 hours, this anneal having to be compatible with the reflector. The bonding energy after this treatment and a good hydrophilic preparation of the surface is 400 mJ/m2. This bonding energy is compatible particularly with an elimination of the manufacturing medium by mechanical or mechanical-chemical thinning.

The manufacturing medium 20 is then eliminated, for example by mechanical or mechanical-chemical thinning stopping at the barrier layer 21. In the case of mechanical thinning, it is preferable to stop the thinning operation before complete elimination of the manufacturing medium and to finish off by chemical thinning. For a manufacturing medium made of silicon, chemical thinning may be obtained by using tetramethylammonium hydroxide (TMAH) or KOH. The structure shown in FIG. 4C is obtained.

The structure obtained may then receive, on the barrier layer 21, an absorbent layer which will then be engraved, the barrier layer 21 then being engraved according to the same patterns. According to another variant, the barrier layer 21 is eliminated prior to deposit and engraving of the absorbent layer.

The thinning of the manufacturing medium may also be carried out by using the process disclosed in the document FR-A-2 681 472. In this case, the face of the manufacturing medium necessarily located facing the reflector is previously subjected to ion implantation, for example according to a dose of $1.5 \cdot 10^{17}$ $H/cm^2$ so as to create a layer of microcavities inside the manufacturing medium and near its implanted face. The thinning of the manufacturing medium may then be obtained by an anneal at 150° C. for 4 hours followed by the application of a mechanical force to complete the cleavage of the medium. The advantage of this technique is the possibility of release from the barrier layer. After cleavage, mechanical-chemical polishing may if need be make it possible to recover a good surface roughness of the thin film left on the structure by the manufacturing medium if it is desired to retain this thin film. In the same way as the barrier layer, the thin film may be retained or totally or partially eliminated.

FIGS. 5A to 5H are transverse cross-section views showing a second variant of the process according to the invention.

Figure 5A:
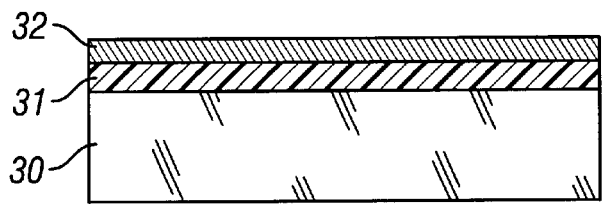
FIGS. 5A to 5H show a second variant of the process for manufacturing a structure for a lithographic reflection mask according to the invention.

FIG. 5A shows a manufacturing medium 30 coated with a barrier layer 31 which may be identical to the corresponding elements described in the first embodiment example. On the barrier layer 31, is deposited a layer 32 of polycrystalline silicon of a thickness of about 200 nm and intended to define the pattern of the absorbent layer.

Figure 5B:
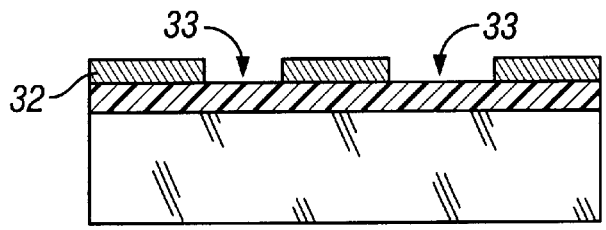

By technologies known to those skilled in the art, the layer 32 is engraved. FIG. 5B shows zones 33 engraved in the layer 32 and revealing the barrier layer 31.

Figure 5C:
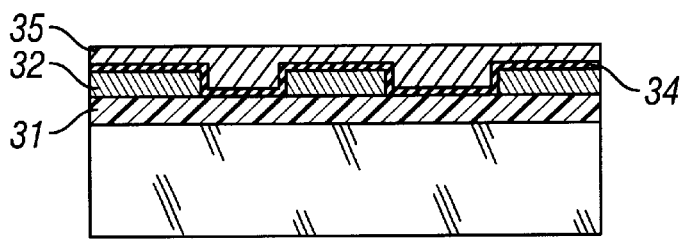
Figure 5D:
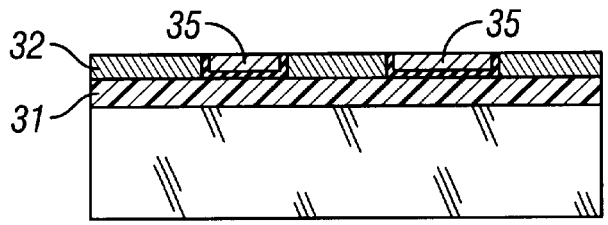

As shown in FIG. 5C, a thin layer 34, which is another barrier layer made of $SiO_2$, is then deposited. The barrier layer 34 coats the engraved layer 32 and the revealed parts of the barrier layer 31 by conforming in shape to the engraved layer 32. A layer 35 of tungsten intended to constitute the absorbent layer is then deposited on the barrier layer 34 conforming to its shape, in other words tungsten is found in the engraved parts of the layer 32.

The next step is the mechanical-chemical polishing of the layer of tungsten 35 down to the barrier layer 34 which is then eliminated above the layer 32. The result obtained may be seen in FIG. 5D.

Figure 5E:
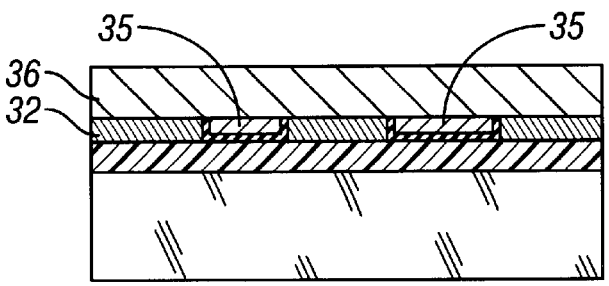
Figure 5F:
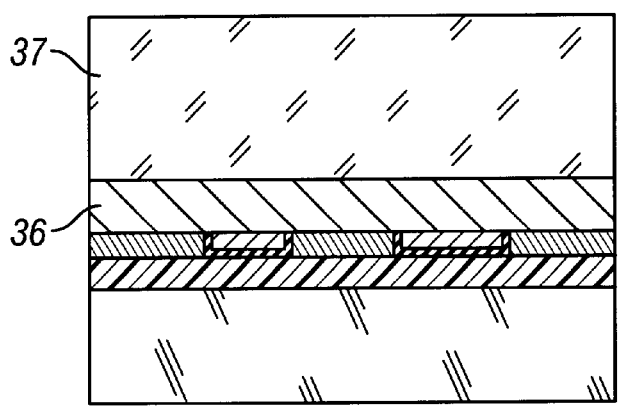
Figure 5G:
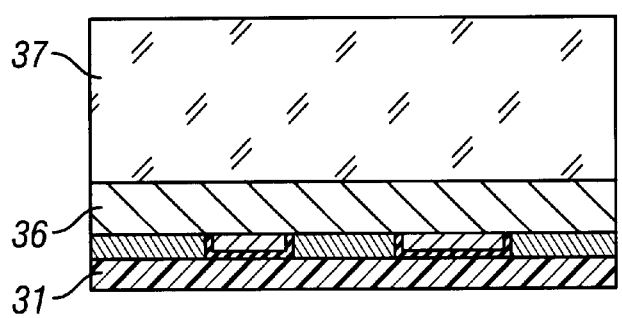
Figure 5H:
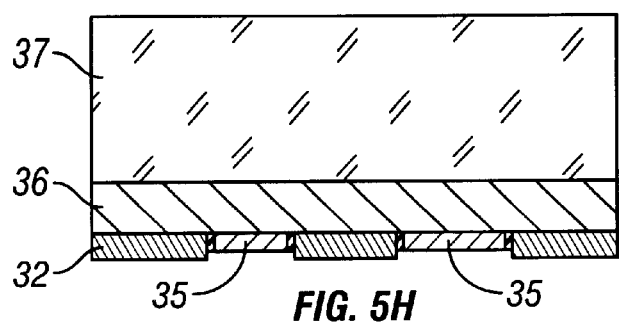

The next step is depositing the reflector 36 on the stack previously obtained (see FIG. 5E). The reflector 36 is for example constituted by 40 pairs of Mo/Si layers starting and finishing with a layer of silicon.

A receive medium 37 is then bonded onto the reflector 36. The bonding is to advantage obtained by molecular adhesion but may also be made from an adhesive substance. The receive medium may be a substrate of ultra-pure vitreous silica. The result obtained may be seen in FIG. 5F.

The manufacturing medium is then eliminated. This elimination may be carried out in the same way as for the first variant of the process according to the invention. The result obtained may be seen in FIG. 5G.

The elimination of the manufacturing medium reveals the barrier layer 31 which is then eliminated as for the first variant of the process according to the invention. This elimination may include the part of the barrier layer 34 still present on the absorbent layer 35. The layer 32 remaining may then be eliminated or retained depending on its optical properties so as to disengage the reflector 36.

Making the multi-layer reflector on a manufacturing medium which is not the final medium gives a certain number of advantages. A first advantage is to make the multi-layer on a substrate of silicon the cleaning processes for which are fully controlled. The invention then allows the active part of the mask to be transferred onto a glass medium with a low coefficient of expansion, for example a silica glass, of ZERODUR® marketed by Schott or of ULE® marketed by Corning, or again of SiC. The process for making the multi-layer implemented on a medium requires no adaptation if another end medium is selected for the mask.

The invention makes it possible to make the absorbent layer, and possibly to engrave it, on the manufacturing medium without technological constraint due to the presence of the multi-layer. There is for example no temperature constraint imposed by the multi-layer the optical performance of which deteriorates beyond a temperature dependent on the type of stack (for a Mo/Si stack, the temperature limit is 200° C.). The invention also gives greater latitude in choosing processes for making the absorbent layer and its engraving.

What is claimed is:

1. A structure for a lithographic reflection mask comprising a receive medium on which is fixed a reflector including at least one layer, the reflector being fixed to the receive medium in a reverse manner relative to a manufacturing medium on which it has been previously manufactured.

2. A structure according to claim 1, wherein the reflector is a multi-layer.

3. A structure according to claim 2, wherein the multi-layer is formed of an alternation of layers of molybdenum and silicon.

4. A structure according to claim 1, wherein the reflector is fixed to the receive medium by means of a bonding layer.

5. A structure according to claim 1, wherein the reflector having been manufactured on a manufacturing medium coated with an absorbent layer for the wavelength of the source of lithographic radiation used, the reflector and the absorbent layer may be fixed to the receive medium in a reverse manner relative to the manufacturing medium.

6. A structure according to claim 5, wherein the absorbent layer coating the manufacturing medium is an engraved layer according to a desired mask pattern.

7. A structure according to claim 1, wherein the receive medium is a substrate of low coefficient of expansion.

8. A process for manufacturing a structure for a lithographic reflection mask, comprising the following stages:

making a reflector on a manufacturing medium, fixing a receive medium on the reflector, at least partly eliminating the manufacturing medium.

9. A process according to claim 8, wherein the reflector is made in the form of a multi-layer.

10. A process according to claim 8, including a preliminary stage of formation of an absorbent layer, for the wavelength of the source of lithographic radiation used, on the manufacturing medium before the reflector is made.

11. A process according to claim 8, wherein the fixing of the receive medium on the reflector is achieved by molecular adhesion.

12. A process according to claim 11, wherein a bonding layer is used to fix the receive medium on the reflector.

13. A process according to claim 8, wherein elimination of the manufacturing medium is carried out by mechanical and/or mechanical-chemical and/or chemical thinning.

14. A process according to claim 13, wherein, the manufacturing medium being provided, reflector side, with a barrier layer, the thinning is carried out until contact is made with the barrier layer.

15. A process according to claim 13, wherein, the manufacturing medium being eliminated using mechanical thinning, the mechanical thinning is stopped before complete elimination of the manufacturing medium, the elimination being then continued chemically.

16. A process according to claim 8, wherein the manufacturing medium comprising, reflector side, a sacrificial layer, the elimination of the manufacturing medium is achieved by selective engraving of the sacrificial layer.

17. A process according to claim 8, wherein the manufacturing medium is a substrate one face of which, intended to be located on the reflector side, has been implanted by gaseous radicals so as to form a layer of microcavities in the substrate and in proximity to the implanted face, the elimination of the manufacturing medium including the application of an anneal and/or mechanical force to obtain the cleavage of the manufacturing substrate along the layer of microcavities.

* * * * *